(12) United States Patent
Nakamura et al.

(10) Patent No.: US 7,435,680 B2
(45) Date of Patent: Oct. 14, 2008

(54) METHOD OF MANUFACTURING A CIRCUIT SUBSTRATE AND METHOD OF MANUFACTURING AN ELECTRONIC PARTS PACKAGING STRUCTURE

(75) Inventors: Junichi Nakamura, Nagano (JP); Tetsuo Sakaguchi, Nagano (JP); Kazuya Mukoyama, Nagano (JP); Sachiko Oda, Nagano (JP); Masahiro Yumoto, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/289,785

(22) Filed: Nov. 30, 2005

(65) Prior Publication Data

US 2006/0121719 A1    Jun. 8, 2006

(30) Foreign Application Priority Data

| Dec. 1, 2004 | (JP) | ............................. 2004-348504 |
| Nov. 11, 2005 | (JP) | ............................. 2005-327314 |

(51) Int. Cl.
*H01L 21/44* (2006.01)

(52) U.S. Cl. .................. 438/678; 438/584; 438/612; 438/613; 438/652

(58) Field of Classification Search .................. 438/584, 438/597, 612, 613, 652, 678
See application file for complete search history.

(56) References Cited

U.S. PATENT DOCUMENTS

| 5,173,766 | A  | * | 12/1992 | Long et al. .................. 257/687 |
| 6,662,442 | B1 | * | 12/2003 | Matsui et al. ................. 29/852 |
| 6,670,718 | B2 | * | 12/2003 | Chinda et al. ............... 257/774 |
| 2002/0185744 | A1 | * | 12/2002 | Katagiri et al. ............. 257/777 |
| 2003/0160325 | A1 | * | 8/2003 | Yoneda et al. .............. 257/758 |

FOREIGN PATENT DOCUMENTS

| JP | 9-283925 | 10/1997 |
| JP | 2001-36238 | 2/2001 |
| JP | 2004-64082 | 2/2004 |

* cited by examiner

*Primary Examiner*—Jerome Jackson
*Assistant Examiner*—Anthony Ho
(74) *Attorney, Agent, or Firm*—Edwards Angell Palmer & Dodge LLP

(57) ABSTRACT

A method of manufacturing a circuit substrate of the present invention, includes the steps of forming an n-layered (n is an integer of 1 or more) wiring layer connected electrically to a metal plate on the metal plate, forming an electroplating layer on a connection pad portion of an uppermost wiring layer of the n-layered wiring layer by an electroplating utilizing the metal plate and the wiring layer as a plating power-supply path, and removing the metal plate.

12 Claims, 14 Drawing Sheets

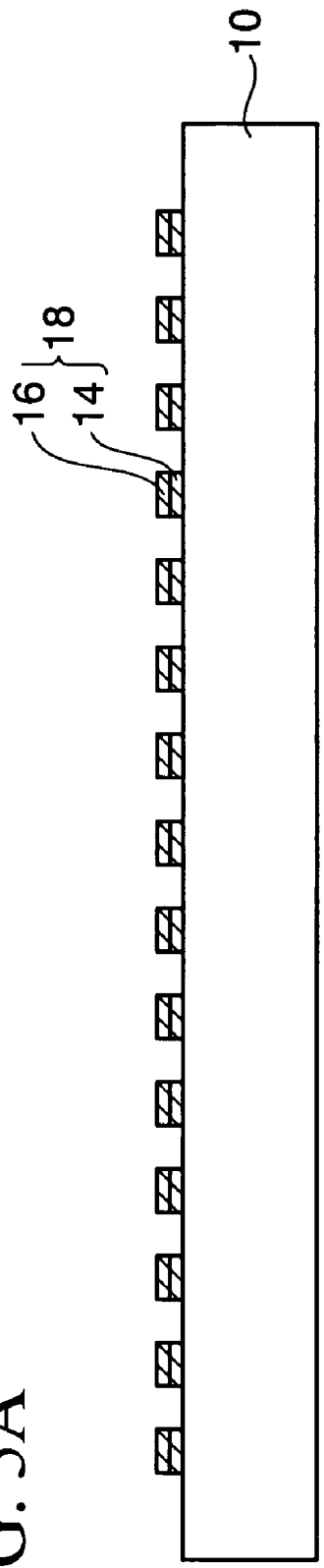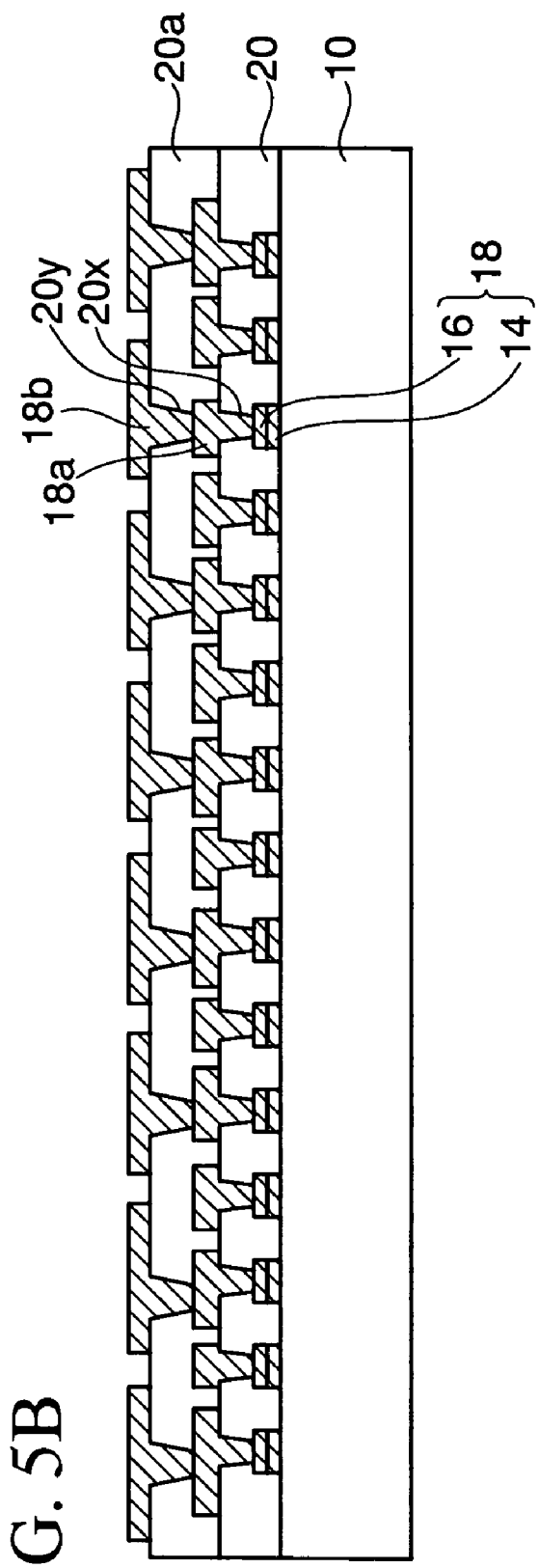

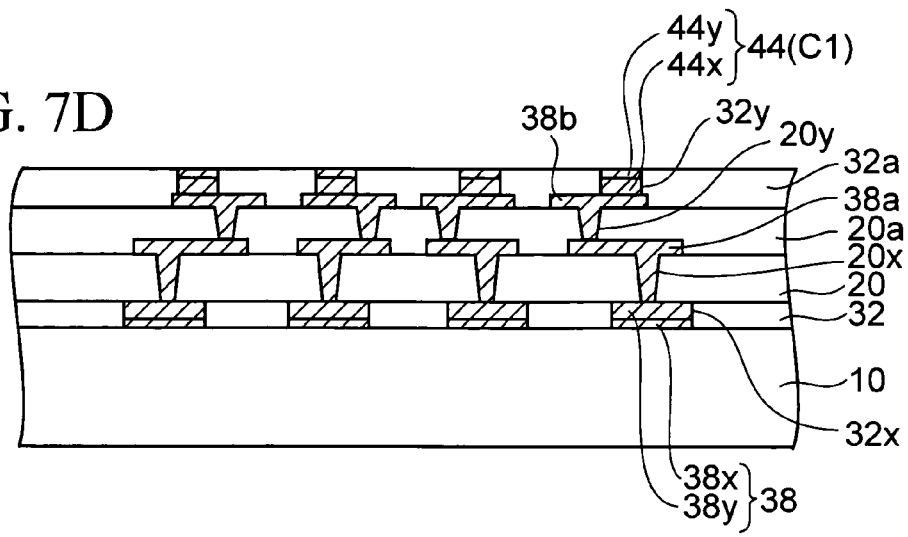
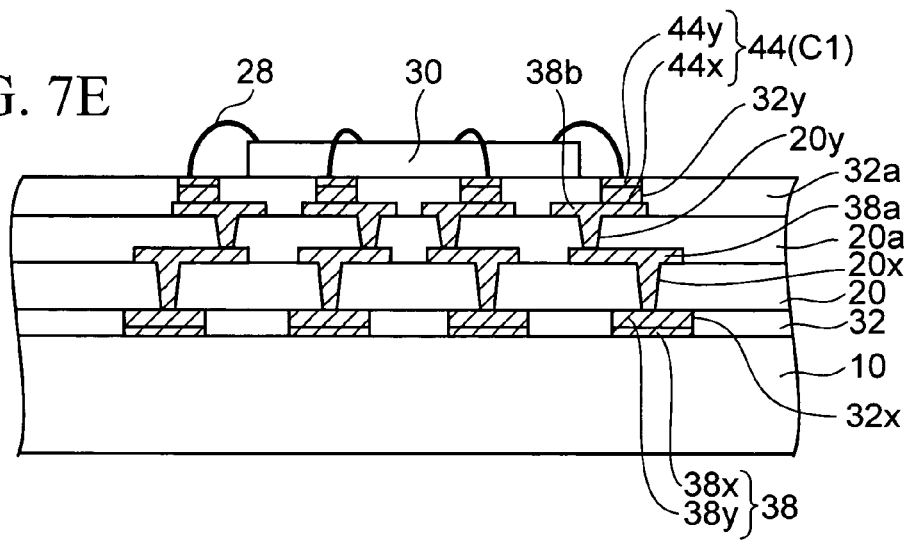
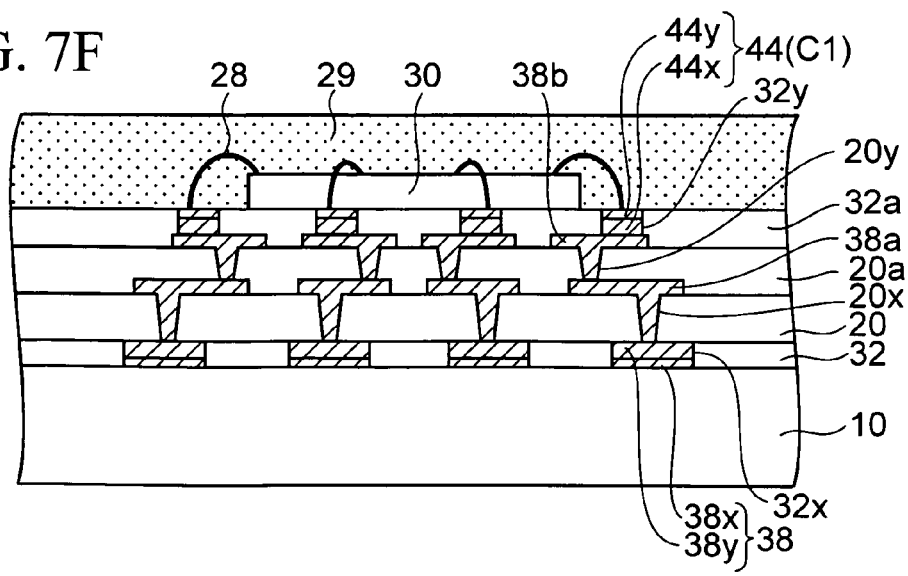

METHOD OF MANUFACTURING A CIRCUIT SUBSTRATE AND METHOD OF MANUFACTURING AN ELECTRONIC PARTS PACKAGING STRUCTURE

CROSS-REFERENCE TO RELATED APPLICATIONS

This application is based on and claims priority of Japanese Patent Applications No. 2004-348504 filed on Dec. 1, 2004, and No. 2005-327314 filed on Nov. 11, 2005, the entire contents of which are incorporated herein by reference.

BACKGROUND OF THE INVENTION

1. Field of the Invention

The present invention relates to a method of manufacturing a circuit substrate and a method of manufacturing an electronic parts packaging structure and, more particularly, a method of manufacturing a circuit substrate onto which electronic parts such as a semiconductor chip, and the like are mounted and a method of manufacturing an electronic parts packaging structure for mounting an electronic parts on the circuit substrate.

2. Description of the Related Art

In the prior art, there exists a circuit substrate on which the electronic parts such as the semiconductor chip, and the like are mounted. In such a circuit substrate, the multi-layered wiring layers are built-in, and the connection pads to which the semiconductor chip is electrically connected are provided to the uppermost portion. The plating layer made of the nickel (Ni)/gold (Au) layer, or the like is provided to the upper portion of the connection pad. For example, in case the semiconductor chip and the connection pads on the circuit substrate are connected by wire bonding, sometimes the plating layer of the connection pad is formed by electroplating to enhance the hardness of the connection pad.

A method of forming an electroplating layer on connection pads on a circuit substrate in the prior art is shown in FIG. 1 and FIG. 2. FIG. 2 is an enlarged plan view showing a portion indicated as a B portion in FIG. 1. As shown in FIG. 1, areas A as respective circuit substrates are defined on a substrate 100, and predetermined multi-layered wiring layers (not shown) are formed in each area A, respectively. Also, a plurality of plating power-supply lines 102 are provided in the substrate 100 to define respective areas A. Each plating power-supply line 102 is connected to a plating power-supply portion 104 provided to an outer peripheral portion of the substrate 100 like a ring. Also, as shown in FIG. 2, a plurality of plating lead wires 108 are connected to the plating power-supply lines 102, and the plating lead wires 108 are connected electrically to each connection pad 106, respectively.

In this manner, each connection pad 106 is connected electrically to the plating power-supply portion 104 via the plating lead wires 108 and the plating power-supply lines 102. Then, when a current is supplied from the plating power-supply portion 104, an electroplating layer is formed on the connection pads 106 by electroplating. Then, the substrate 100 is cut so that respective circuit substrates may be obtained, and then the plating power-supply lines 102 and the plating power-supply portion 104 are discarded.

Meanwhile, in the semiconductor chip, such as a CPU, or the like, because the number of connection portions is increased following upon an increase of the I/0 number, the number of connection pads on the circuit substrate is also increased and thus a pitch between the connection pads is made narrower. When a pitch between the connection pads on the circuit substrate is reduced smaller, it is difficult to provide a predetermined number of plating power-supply lines between the connection pads in parallel with each other. As a result, the connection pads on which the electroplating layer cannot be formed are generated.

SUMMARY OF THE INVENTION

It is an object of the present invention to provide a method of manufacturing a circuit substrate, capable of an electroplating layer on connection pads without any disadvantage even when the number of connection pads on a circuit substrate is increased to make a pitch between them narrower, and a method of manufacturing an electronic parts packaging structure for mounting an electronic parts on the circuit substrate.

The present invention is concerned with a method of manufacturing a circuit substrate, which includes the steps of forming an n-layered (n is an integer of 1 or more) wiring layer connected electrically to a metal plate on the metal plate; forming an electroplating layer on a connection pad portion of an uppermost wiring layer of the n-layered wiring layer by an electroplating utilizing the metal plate and the wiring layer as a plating power-supply path; and removing the metal plate.

In the present invention, first the predetermined built-up wiring layer connected electrically to the metal plate is formed on the metal plate. Then, the electroplating layer (the Ni/Au layer, or the like) is formed on the connection pad portion of the uppermost wiring layer by the electroplating utilizing the metal plate and the built-up wiring layer as the plating power-supply path. The connection pad portion of the wiring layer is defined by the opening portion of the resin layer (the solder resist film, or the like) formed on the wiring layer. Then, the metal plate is removed selectively with respect to the wiring layer.

As described above, in the present invention, the metal plate and the wiring layer connected electrically to the metal plate are utilized as the plating power-supply path of the electroplating. Therefore, unlike the prior art, there is no need to form the plating power-supply line connected electrically to each connection pad. As a result, even when the number of the connection pads on the circuit substrate is increased and a pitch between them is made narrower, the electroplating layer can be easily formed on the connection pad without any disadvantage.

In the circuit substrate manufactured by the manufacturing method of the present invention, the electroplating layer such as the Ni/Au layer, or the like, which is formed by the electroplating on the connection pad to have a high hardness, is formed as the contact layer. Therefore, when the semiconductor chip is mounted onto the circuit substrate and then the semiconductor chip and the connection pad of the circuit substrate are connected via the wire provided by the wire bonding method, the wire can be bonded electrically to the connection pad with good reliability, so that the reliability of the semiconductor device can be improved.

Alternately, the bump of the semiconductor chip may be flip-chip connected to the lowermost wiring layer exposed after the metal plate is removed. In the case of this mode, the connection pad of the uppermost wiring layer is used as the land of LGA.

Also, the present invention is concerned with a method of manufacturing an electronic parts packaging structure, comprising the steps of forming an n-layered (n is an integer in excess of 1) wiring layer connected electrically to a metal plate on the metal plate; forming an electroplating layer on a connection pad portion of an uppermost wiring layer in the n-layered wiring layer by an electroplating utilizing the metal plate and the wiring layer as a plating power-supply path; mounting an electronic parts connected electrically to the electroplating layer provided onto the uppermost wiring layer; and exposing a bottom surface of the lowermost wiring layer in the n-layered wiring layer by removing the metal plate.

In the present invention, the circuit substrate having high-density connection pads corresponding to fine-pitch terminals of the electronic parts (semiconductor chip, or the like) is manufactured based on the above method of manufacturing a circuit substrate, then the semiconductor chip, or the like is mounted on the circuit substrate, and then the metal plate is removed. Thus, the high-performance electronic parts packaging structure can be manufactured easily.

Here, in Patent Literature 1 (Patent Application Publication (KOKAI) 2001-36238), Patent Literature 2 (Patent Application Publication (KOKAI) Hei 9-283925), and Patent Literature 3 (Patent Application Publication (KOKAI) 2004-64082), the method of forming the wiring layer on the metal supporting plate and then removing the metal plate is set forth. However, in Patent Literatures 1 to 3, it is not taken into account at all that the electroplating layer is formed locally on the portion, which acts as the connection pad of the wiring layer, by utilizing the metal plate as the plating power-supply layer. Therefore, it is concluded that these Patent Literatures 1 to 3 provide no suggestion as to the constitutions of the present invention.

BRIEF DESCRIPTION OF THE DRAWINGS

FIGS. 5A to 5D are sectional views showing a method of manufacturing a circuit substrate according to a second embodiment of the present invention.

FIGS. 7A to 7J are sectional views showing a method of manufacturing an electronic parts packaging structure according to a third embodiment of the present invention.

DETAILED DESCRIPTION OF THE PREFERRED EMBODIMENTS

Embodiments of the present invention will be explained with reference to the accompanying drawings hereinafter.

First Embodiment

Figure 1:
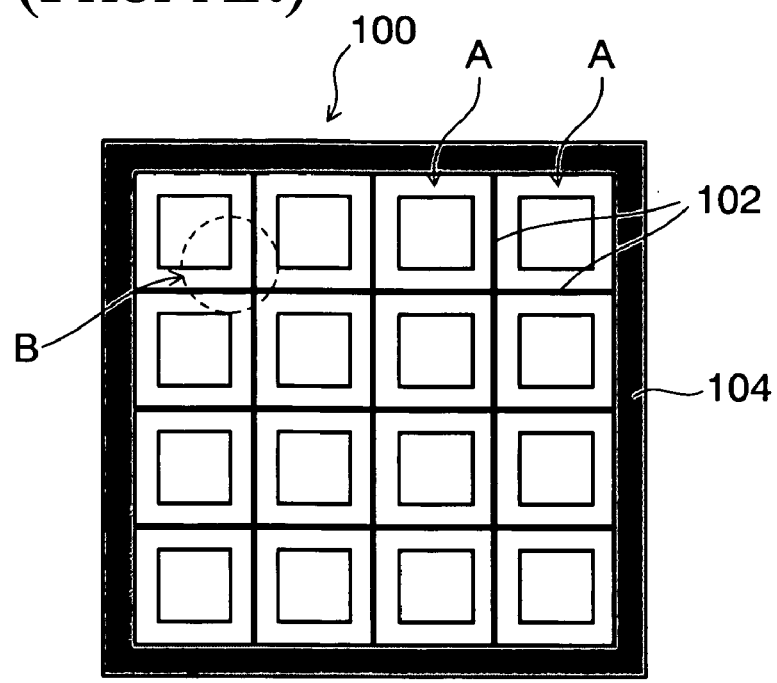
FIG. 1 is a plan view showing a method of forming an electroplating layer on connection pads on a circuit substrate in the prior art.
Figure 2:
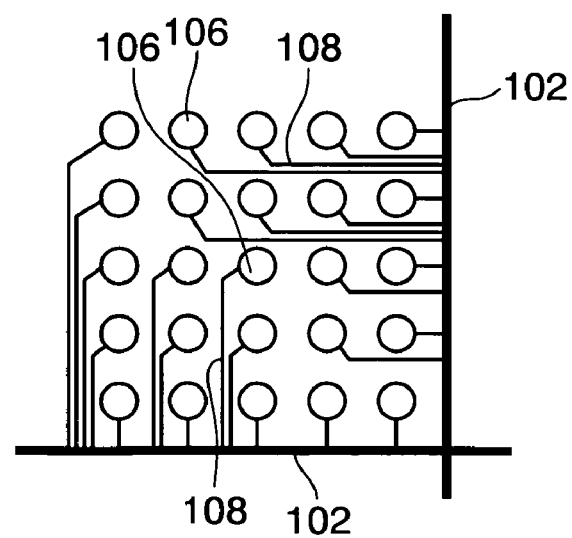
FIG. 2 is an enlarged plan view showing a portion indicated as a B portion in FIG. 1.
Figure 3A:
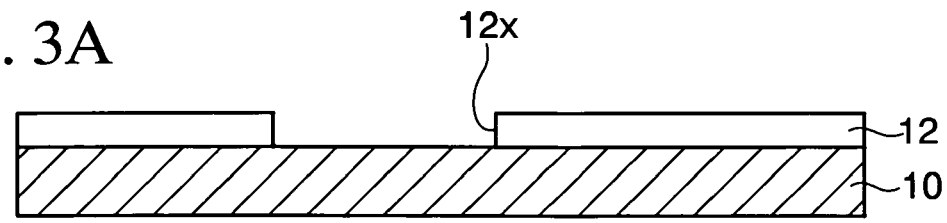
FIGS. 3A to 3J are sectional views showing a method of manufacturing a circuit substrate according to a first embodiment of the present invention.

FIGS. 3A to 3J are sectional views showing a method of manufacturing a circuit substrate according to a first embodiment of the present invention in sequence. As shown in FIG. 3A, first a metal plate 10 serving as a supporting plate made of copper (Cu), or the like is prepared, and then a dry film resist (plating resist) 12 in which an opening portion 12$x$ is provided is formed on the metal plate 10. A flexible metal member such as a metallic foil is also contained in the metal plate 10.

Figure 3B:
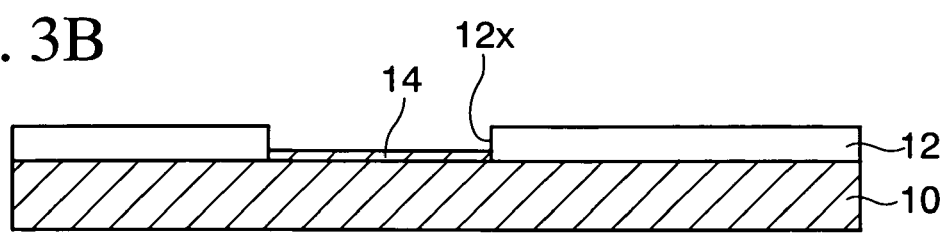

Then, as shown in FIG. 3B, a gold (Au) layer is formed and then a nickel (Ni) layer is formed in a portion of the metal plate 10, which is exposed from the opening portion 12$x$ in the dry film resist 12, by the electroplating utilizing the metal plate 10 as a plating power-supply layer, Thus, an Au/Ni plating layer 14 is obtained. In this case, a tin (Sn) plating layer may be formed in place of the Au/Ni plating layer.

Figure 3C:
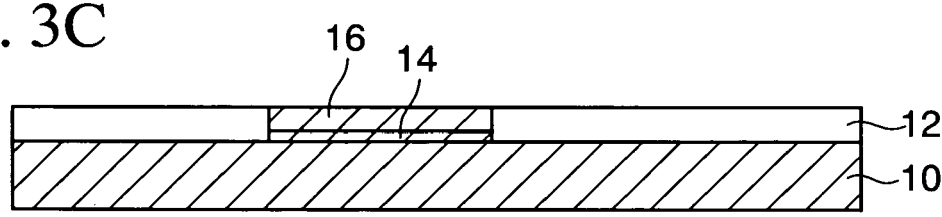
Figure 3D:
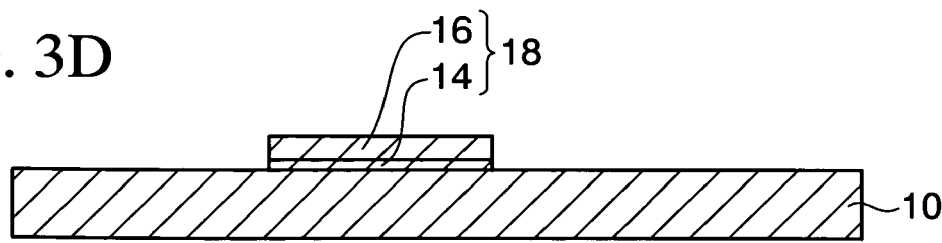

Then, as shown in FIG. 3C, a metal layer 16 made of Cu, or the like is formed on the Au/Ni plating layer 14 by the electroplating utilizing the metal plate 10 as the plating power-supply layer. Then, as shown in FIG. 3D, the dry film resist 12 is removed. Thus, a first wiring layer 18 composed of the Au/Ni plating layer 14 and the metal layer 16 is obtained.

Figure 3E:
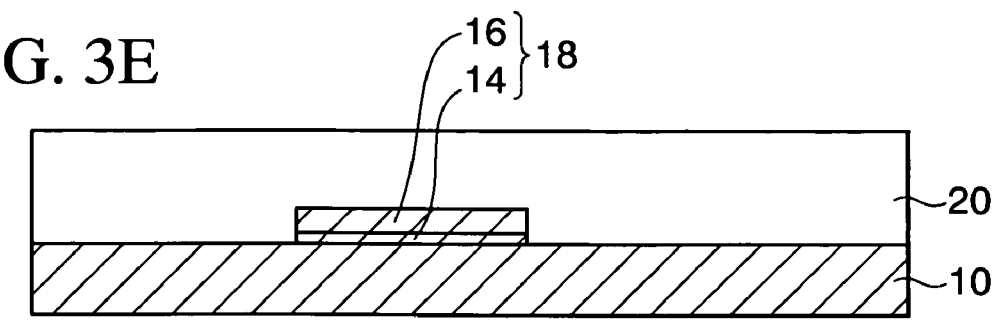
Figure 3F:
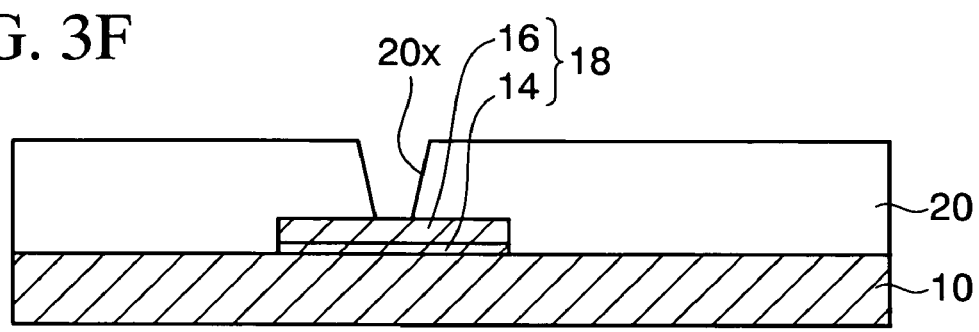

Then, as shown in FIG. 3E, a surface roughening process is applied to the upper surface side of the metal plate 10, and then a first interlayer insulating layer 20 for covering the first wiring layer 18 is formed by pasting a resin film (an epoxy resin, or the like), or the like. Then, as shown in FIG. 3F, the first interlayer insulating layer 20 is processed by the laser, or the like, and thus a first via hole 20$x$ having a depth that reaches the first wiring layer 18 is formed.

Figure 3G:
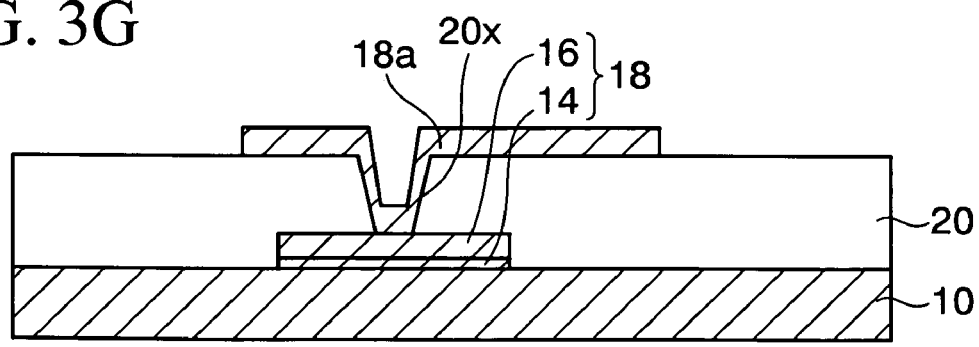

Then, as shown in FIG. 3G, a second wiring layer 18$a$ connected to the first wiring layer 18 via the first via hole 20$x$ is formed on the first interlayer insulating layer 20 by the semi-additive process, for example. To explain in detail, first a seed layer (not shown) made of Cu, or the like is formed in the first via hole 20$x$ and on the first interlayer insulating layer 20 by the electroless plating or the sputter method. Then, a resist film (not shown) in which an opening portion is provided to the portion, in which the second wiring layer 18$a$ is formed, is patterned. Then, a metal layer pattern (not shown) is formed on the seed layer in the opening portion in the resist film by the electroplating utilizing the seed layer as the plating power-supply layer. Then, the second wiring layer 18$a$ is formed by removing the resist film and then etching the seed layer using the metal layer pattern as a mask.

Figure 3H:
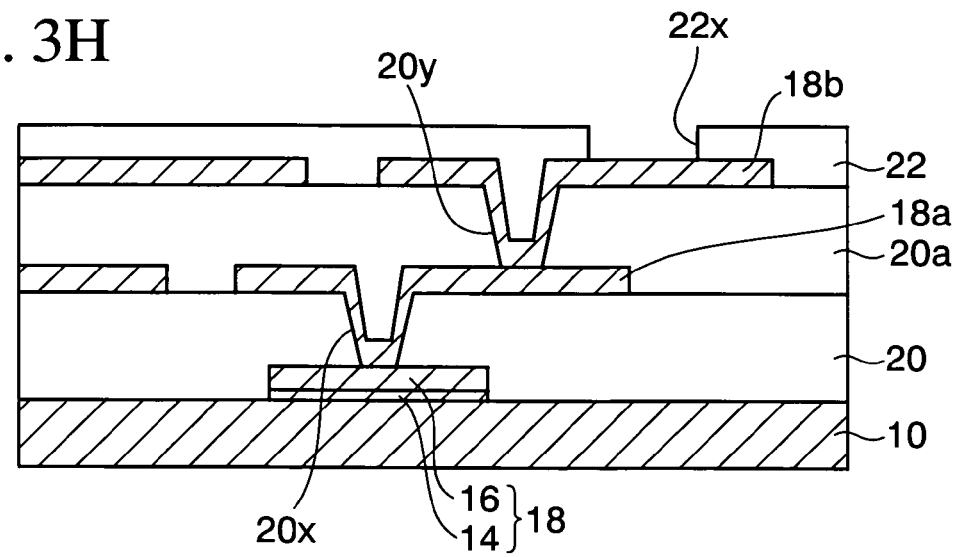

Then, as shown in FIG. 3H, a second interlayer insulating layer 20$a$ similar to the above first interlayer insulating layer 20 is formed on the second wiring layer 18$a$. Then, the second interlayer insulating layer 20$a$ is processed by the laser, or the like, and thus a second via hole 20$y$ having a depth that reaches the second wiring layer 18$a$ is formed. Then, a third wiring layer 18$b$ connected to the second wiring layer 18$a$ via the second via hole 20$y$ is formed on the second interlayer insulating layer 20$a$ by the same method as the above method of forming the second wiring layer 18$a$. Then, as also shown in FIG. 3H, a solder resist film 22 (a resin layer) in which an opening portion 22$x$ is provided in the portion that acts as the connection pad of the third wiring layer 18$b$ is formed.

Figure 3I:
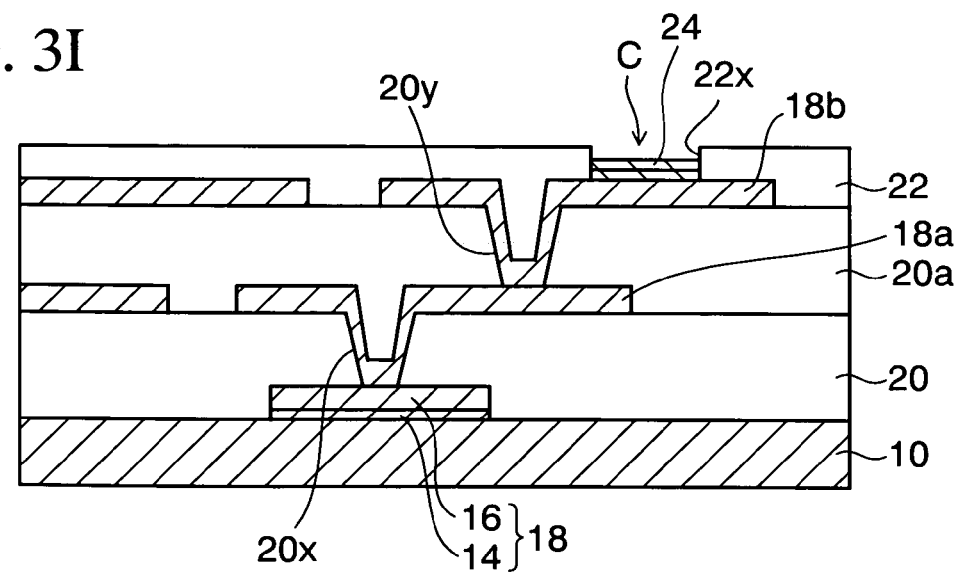

Then, as shown in FIG. 3I, an Ni/Au plating layer 24 (electroplating layer) is obtained by forming a Ni layer and then forming an Au layer on the portion, which acts as the connection pad on the third wiring layer 18$b$, in the opening portion 22$x$ in the solder resist film 22 by the electroplating using the metal plate 10, the first wiring layer 18, the second wiring layer 18$a$, and the third wiring layer 18$b$ as the plating power-supply path. Thus, a connection pad C is formed on the third wiring layer 18$b$.

Figure 3J:
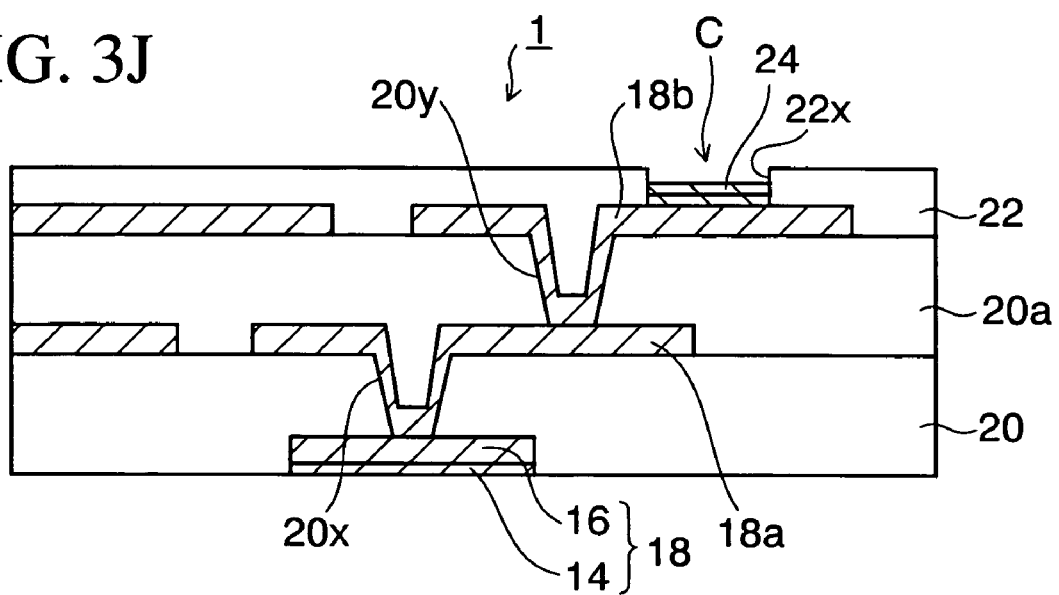

Then, as shown in FIG. 3J, the metal plate 10 is etched selectively with respect to the first wiring layer 18 and the first interlayer insulating layer 20 and is removed. In case the metal plate 10 is made of copper, the wet etching using an iron (III) chloride aqueous solution, a copper (II) chloride aqueous solution, an ammonium peroxodisulfate aqueous solution, or the like is employed as the etching of the metal plate 10, so that the metal plate 10 can be removed selectively with respect to the first wiring layer 18 and the first interlayer insulating layer 20. Thus, a lower surface of the first interlayer insulating layer 20 is exposed and also a lower surface of the Au/Ni plating layer 14 (or the Sn plating layer) of the first wiring layer 18 is exposed.

With the above, a circuit substrate 1 according to the present embodiment can be obtained. In the present embodiment, such a mode is exemplified that the three-layered built-up wiring layer is formed. But the number of stacked layers may be set arbitrarily, and such a mode may be employed that an n-layered (n is an integer of 1 or more) built-up wiring layer is formed. Also, when the manufacturing method to get a plurality of circuit substrates is employed, a resultant structure in FIG. 3J is cut into a plurality of circuit substrates 1.

Then, as shown in FIG. 3J, in the circuit substrate 1 manufactured by the manufacturing method of the present embodiment, the first wiring layer 18 is buried in the first interlayer insulating layer 20, and the lower surface of the Au/Ni plating layer 14 (or the Sn plating layer) is exposed. Also, the second wiring layer 18a connected to the first wiring layer 18 via the first via hole 20x provided in the first interlayer insulating layer 20 is formed on the first interlayer insulating layer 20. The second interlayer insulating layer 20a is formed on the second wiring layer 18a, and the third wiring layer 18b connected to the second wiring layer 18a via the second via hole 20y provided in the second interlayer insulating layer 20a is formed on the second interlayer insulating layer 20a. In this way, the first to third wiring layers 18 to 18b are connected mutually via the first and second via holes 20x, 20y.

Then, the solder resist film 22 in which the opening portion 22x is provided on the connection pad C of the third wiring layer 18b is formed on the third wiring layer 18b. Then, the Ni/Au plating layer 24 formed by electroplating utilizing the metal plate 10, which has been finally removed, and the first to third wiring layers 18 to 18b as the plating power-supply path is formed on the connection pad C of the third wiring layer 18b in the opening portion 22x of the solder resist film 22.

In the manufacturing method of the present embodiment, as described above, the electroplating layer is formed on the connection pad C of the third wiring layer 18b by utilizing the metal plate 10 and the first to third wiring layers 18 to 18b as the plating power-supply path of the electroplating. Therefore, unlike the prior art, there is no necessity to provide the plating power-supply lines, each connected to the connection pad C, in the area between the connection pads C in parallel with each other.

Therefore, even when the number of the connection pads C is increased and a pitch between them is made narrower, it is feasible to overcome the disadvantage such that the connection pad to which the electroplating cannot be applied is generated, so that the electroplating layer can be easily formed on all connection pads C. In this manner, the present embodiment can deal easily with the case where the number of the connection pads C of the circuit substrate 1 is increased and a pitch between them is made narrower, without any trouble.

In contrast, in the above prior art in which the plating lead wires are connected to the connection pads respectively and then the electroplating is applied to them, for example, about 20 plating lead wires must be provided between the connection pads C in the case where a diameter of the connection pad C is 750 µm, a pitch is 1000 µm (a space between the connection pads is 250 µm), and a full grid arrangement of 40 row×40 column is employed. In that case, it is easily understood that, because a wiring rule is 6/6 µm (line/space), it is extremely difficult to form such wiring.

Figure 4:
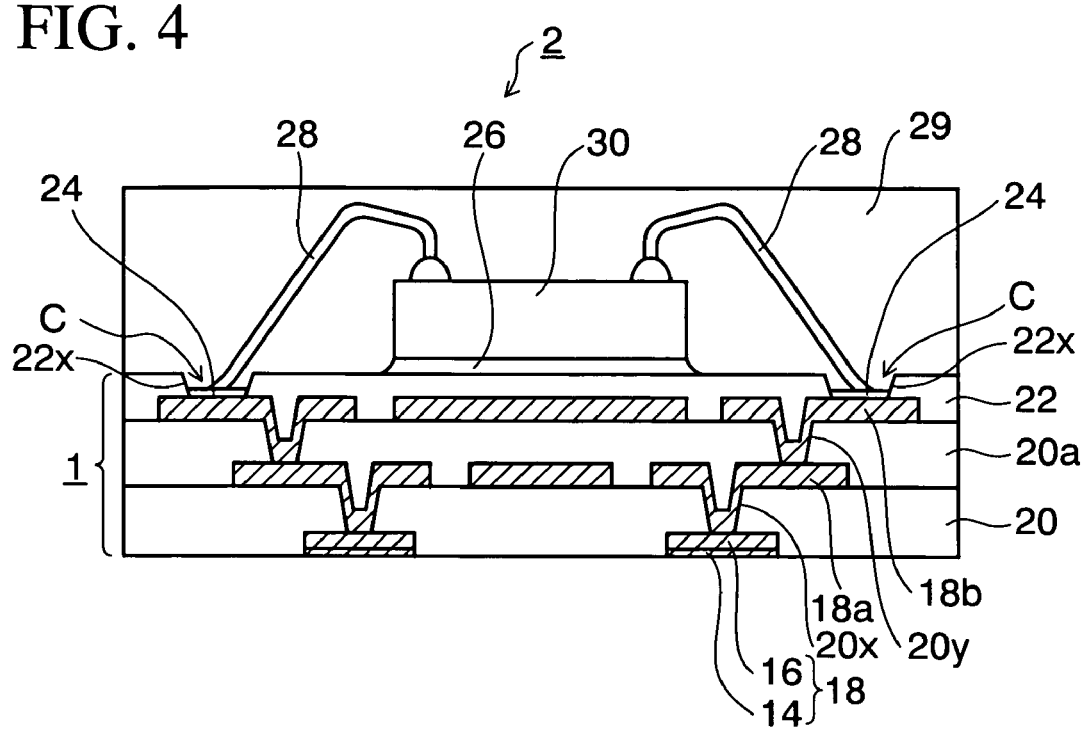
FIG. 4 is a sectional view showing a semiconductor device in which a semiconductor chip is mounted onto the circuit substrate according to the first embodiment of the present invention.

An example of a semiconductor device in which the semiconductor chip is mounted onto the circuit substrate of the first embodiment is shown in FIG. 4. As shown in FIG. 4, in a semiconductor device 2, a semiconductor chip 30 is secured onto the solder resist film 22 of the circuit substrate 1 explained as above via an adhesive layer 26 in a state that it connection portion is directed upward. Then, the connection portions on the upper surface side of the semiconductor chip 30 and the connection pads C of the circuit substrate 1 are connected electrically via wires 28 formed by the wire bonding method. Then, the semiconductor chip 30 and the wires 28 are sealed with a molding resin 29.

Since the upper portion of the connection pad C of the circuit substrate 1 is formed of the Ni/Au plating layer 24 that is formed by the electroplating to have a high hardness, the connection portions of the semiconductor chip 30 and the connection pads C of the circuit substrate 1 are connected by the wires 28 with good reliability. Thus, the reliability of the semiconductor device 2 can be improved.

In FIG. 4, the case where the circuit substrate 1 is used as the LGA (Land Grid Array) type is illustrated by an example, and the connection portion (the Au/Ni plating layer 14) of the first wiring layer 18 exposed from the lower surface of the circuit substrate is used as the land. Another mode in which the Au/Ni plating layer 14 of the first wiring layer 18 is replaced with another metal plating layer such as the Sn plating layer may be employed according to the application of the circuit substrate.

Also, in the case where the circuit substrate 1 is used as the BGA (Ball Grid Array) type or the PGA (Pin Grid Array) type, the solder resist film in which the opening portion is provided to the connection portion of the first wiring layer 18 is formed on the lower surface of the circuit substrate 1, and then the external connection terminal such as the solder ball, the lead pin, or the like is connected to the first wiring layer 18. Then, the connection portions (lands) of the first wiring layers 18 or the external connection terminals are connected onto the wiring board (mother board).

Second Embodiment

FIGS. 5A to 5D are sectional views showing a method of manufacturing a circuit substrate according to a second embodiment of the present invention. The second embodiment shows such a mode that the circuit substrate explained in the first embodiment is turned upside down and then the semiconductor chip is flip-chip connected to the exposed portions of the first wiring layers. In the second embodiment, detailed explanation of the same steps as those in the first embodiment will be omitted herein.

As shown in FIG. 5A, like the first embodiment, first, the first wiring layers 18 each composed of the Au/Ni plating layer 14 and the metal layer 16 are formed on the metal plate 10. Here, the tin (Sn) plating layer may be formed instead of the Au/Ni plating layer 14. Then, as shown in FIG. 5B, according to the same method as the first embodiment, the second wiring layers 18a connected to the first wiring layers 18 via the first via holes 20x provided in the first interlayer insulating layer 20 are formed on the first interlayer insulating layer 20, and then the third wiring layers 18b connected to the second wiring layers 18a via the second via holes 20y provided in the second interlayer insulating layer 20a are formed on the second interlayer insulating layer 20a.

Figure 5C:
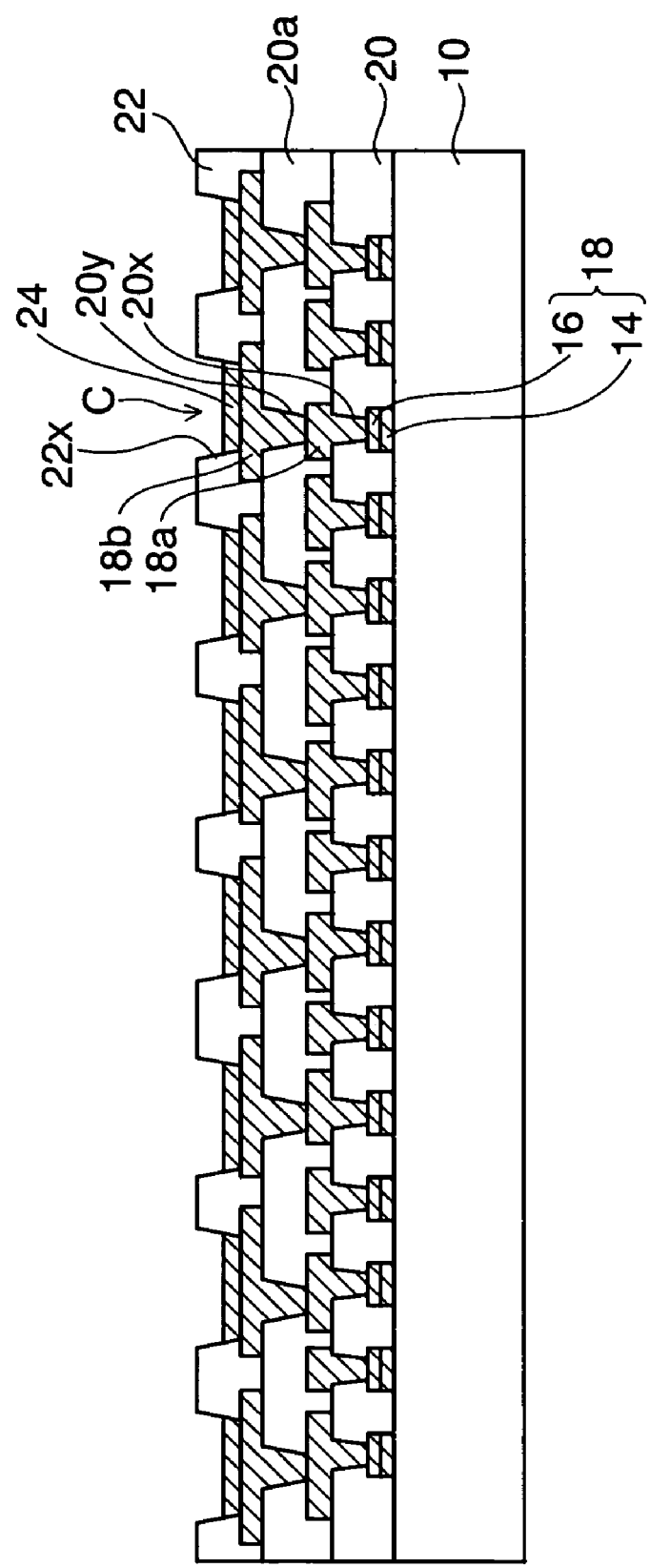

Then, as shown in FIG. 5C, the solder resist film 22 in which the opening portions 22x are provided to the portions, which act as the connection pads of the third wiring layers 18b, is formed. Then, like the first embodiment, the Ni/Au plating layers 24 are formed in the portion of the third wiring layers 18b in the opening portions 22x of the solder resist film 22 by the electroplating utilizing the metal plate 10 and the first to third wiring layers 18 to 18b as the plating power-supply paths. Thus, the connection pads C are obtained.

Figure 5D:
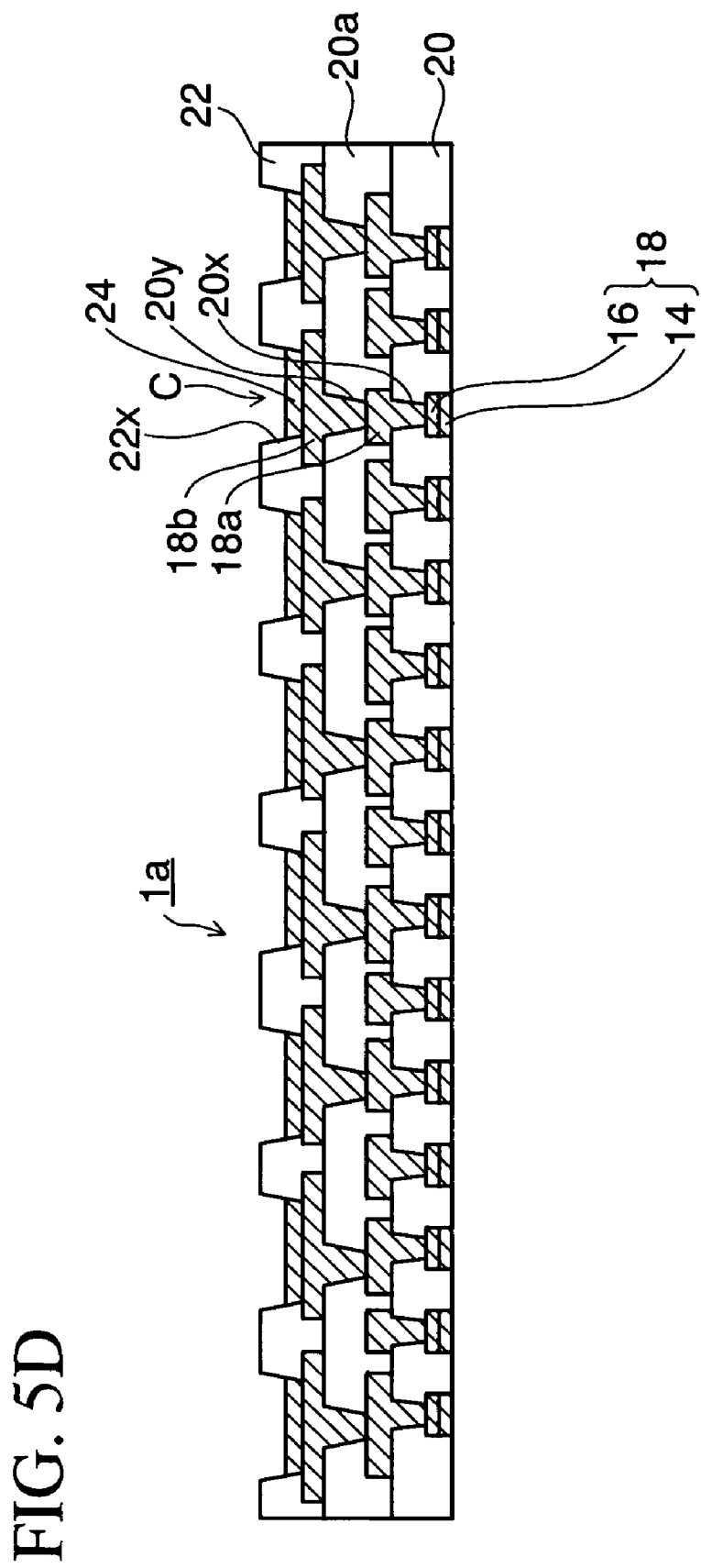

Then, as shown in FIG. 5D, like the first embodiment, the metal plate 10 is removed selectively with respect to the first wiring layers 18 and the first interlayer insulating layer 20. Thus, a circuit substrate 1a according to the second embodiment is obtained. In the second embodiment, the number of stacked layers of the built-up wiring layer may also be set arbitrarily, and an n-layered (where n is an integer of 1 or more) built-up wiring layer may also be formed.

Figure 6:
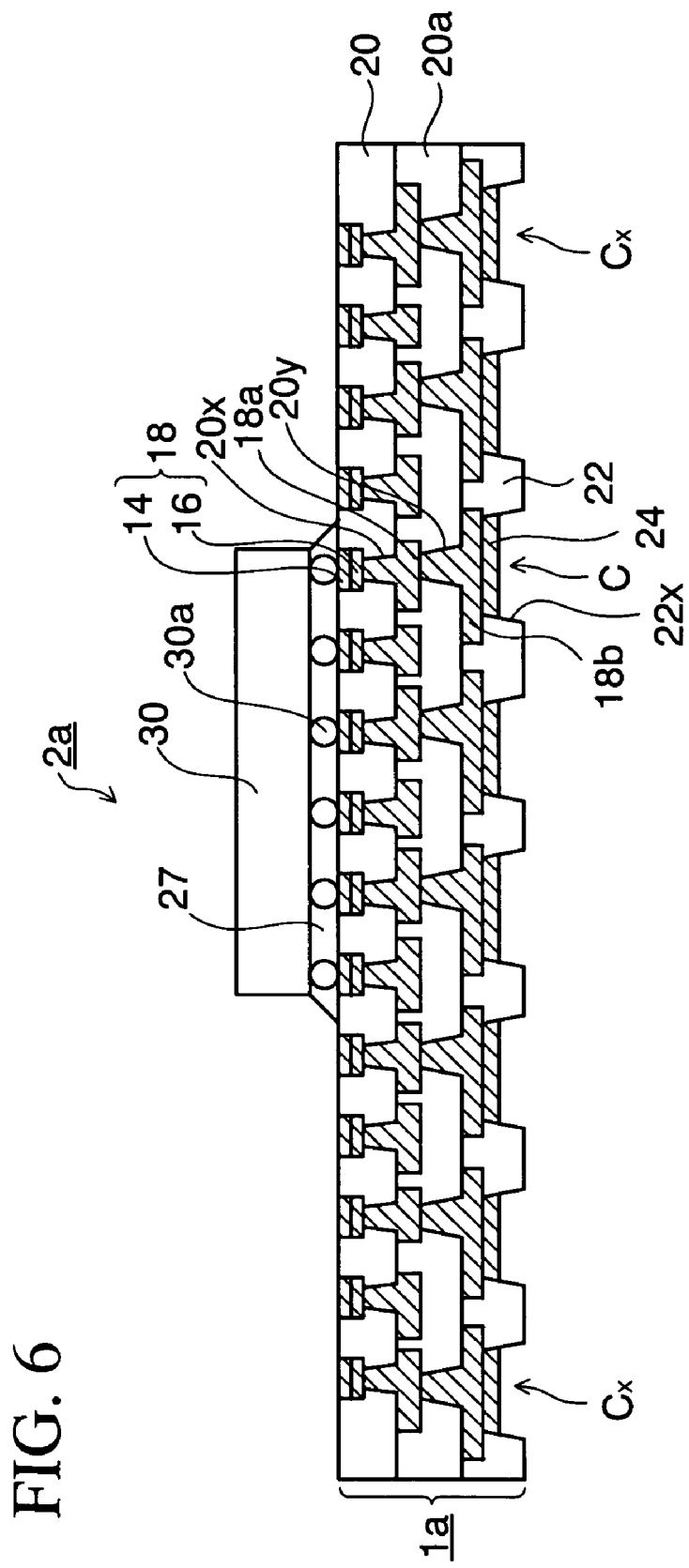
FIG. 6 is a sectional view showing a semiconductor device in which a semiconductor chip is mounted onto the circuit substrate according to the second embodiment of the present invention.

Then, as shown in FIG. 6, when the circuit substrate 1a in FIG. 5D is turned upside down, the Au/Ni plating layers 14 (or the Sn plating layers) of the first wiring layers 18 are exposed from the upper surface of the circuit substrate 1a. Then, bumps 30a of the semiconductor chip 30 are flip-chip connected to the Au/Ni plating layers 14 (or the Sn plating layers) on the upper surface of the circuit substrate 1a. Then, an underfill resin 27 is filled in a clearance under the semiconductor chip 30.

Accordingly, a semiconductor device 2a in which the semiconductor chip 30 is mounted onto the circuit substrate 1a according to the second embodiment is obtained. The case where the circuit substrate 1a is used as the LGA (Land Grid Array) type is illustrated by an example in FIG. 6, and the connection portions C of the third wiring layers 18b exposed from the lower surface of the circuit substrate 1a is used as the land. In the second embodiment, since the electroplating layer having a high hardness is formed on the connection portions C (the lands of the LGA) of the third wiring layers 18b of the circuit substrate 1a, the circuit substrate 1a of the LGA type can be connected electrically to the wiring board (mother board) with good reliability.

In this case, in order to keep the balance in mounting the circuit substrate 1a onto the wiring board (mother board), and the like, sometimes connection pads Cx (connection pads on the peripheral side in FIG. 6), which are not used electrically, are provided to the circuit substrate 1a. Thus, such connection pads Cx may be mixedly used.

The second embodiment can achieve the similar advantages to the first embodiment. In the second embodiment, according to the application of the circuit substrate, various metal plating layers may be employed as the Au/Ni plating layer 14 of the first wiring layer 18 and the Ni/Au plating layer 24 of the connection pad C of the third wiring layer 18b.

In particular, when the Au/Ni plating layer 14 of the first wiring layer 18 is replaced with the Sn plating layer, there is no need to form the solder bumps by another step in flip-chip connecting the semiconductor chip 30 to the first wiring layer 18. Thus, production steps can be simplified.

Third Embodiment

FIGS. 7A to 7J are sectional views showing a method of manufacturing an electronic parts packaging structure according to a third embodiment of the present invention. In the third embodiment, a method of mounting an electronic parts on a circuit substrate based on the technical idea of the method of manufacturing the circuit substrate of the present invention will be explained hereunder.

Figure 7A:
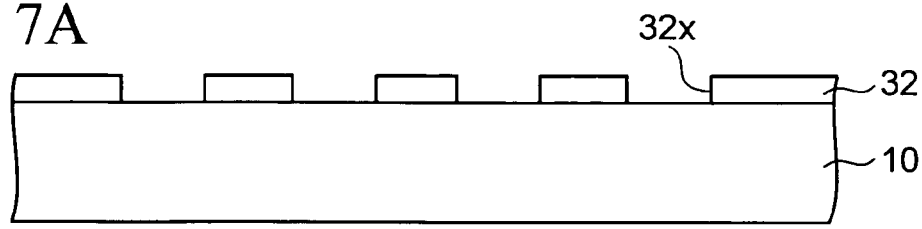

As shown in FIG. 7A, first, the metal plate 10 serving as the supporting substrate similar to the first embodiment is prepared. Then, a first solder resist film 32 in which opening portions 32x are provided is formed. The first solder resist film 32 is formed to be patterned such that the opening portions 32x are provided in portions corresponding to areas in which external connection pads are formed later.

Figure 7B:
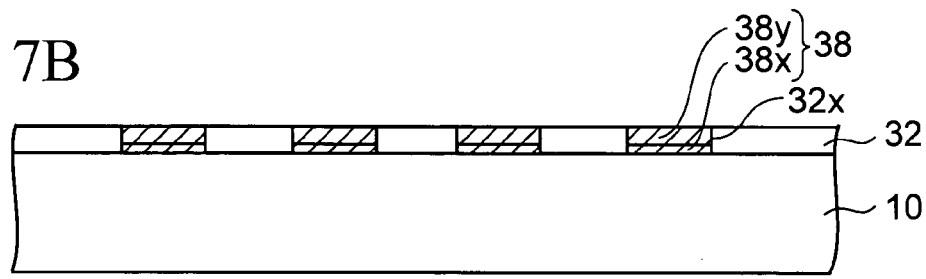

Then, as shown in FIG. 7B, a first wiring layer 38 consisting of a gold (Au) layer 38x and a palladium (Pd)/nickel (Ni) layer 38y in order from the bottom is formed in the opening portions 32x in the first solder resist film 32 by the electroplating utilizing the metal plate 10 as the plating power-supply layer. The first wiring layer 38 is formed of a laminated metal plating layer that contains the Au layer 38x as a lowermost layer that contacts the metal plate 10. Also, the first wiring layer 38 may be formed of various laminated plating layer such as the Au/Ni layer, or the like. As described later, the first wiring layer 38 acts as the external connection pad when a lowermost Au layer 38x is exposed.

Figure 7C:
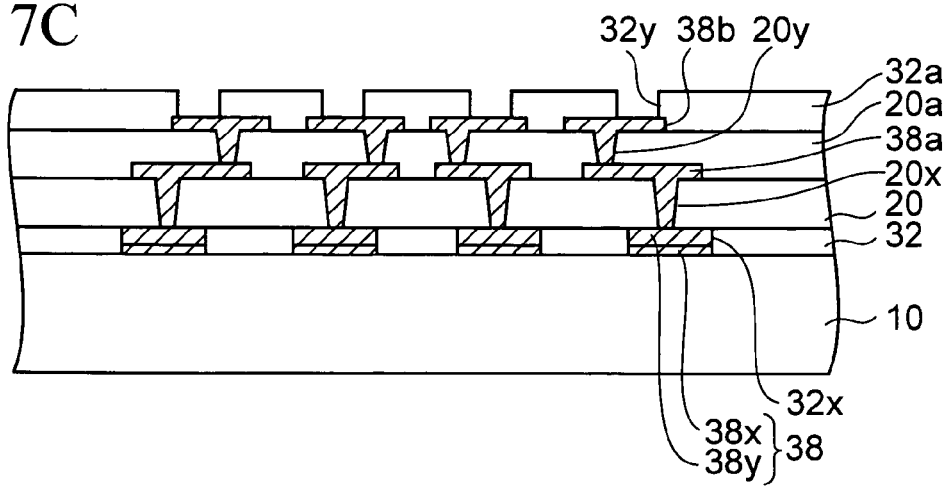

Then, as shown in FIG. 7C, according to the same method as the first embodiment, second wiring layers 38a each connected electrically to the first wiring layer 38 via the first via hole 20x, which is provided in the first interlayer insulating layer 20 to cover the first wiring layers 38 and the first solder resist film 32, are formed on the first interlayer insulating layer 20. Then, third wiring layers 38b each connected electrically to the second wiring layer 38a via the second via hole 20y, which is provided in the second interlayer insulating layer 20a to cover the second wiring layers 38a, are formed on the second interlayer insulating layer 20a. In the present embodiment, a mode in which the first to third wiring layers 38 to 38b are stacked on the metal plate 10 is exemplified. But a mode in which an n-layered (n is an integer of 1 or more) built-up wiring layer is formed on the metal plate 10 may be employed.

Then, as also shown in FIG. 7C, a second solder resist film 32a in which opening portions 32y are provided on the connection pads of the third wiring layers 38b is formed. Then, as shown in FIG. 7D, like the first embodiment, electroplating layers 44 each consisting of a Ni/Pd layer 44x and an Au layer 44y from the bottom in order are formed as upper connection pads C1 in the connection pads of the third wiring layer 38b in the opening portions 32y of the second solder resist film 32a, by the electroplating utilizing the metal plate 10, the first, second, third wiring layers 38, 38a, 38b as the plating power-supply path. In this case, the electroplating layer 44 is formed of a laminated metal plating layer from the uppermost side of which the Au layer 44y is exposed. Various laminated plating layer such as the Au/Ni layer, or the like may be used as the electroplating layer 44.

In this manner, the electroplating layer 44 provided on the uppermost wiring layer of the built-up wiring layer is formed such that the Au layer 44y is exposed to the outside.

Then, as shown in FIG. 7E, a semiconductor chip 30 having connection portions (not shown) on the upper surface side is prepared as the electronic parts. Then, the semiconductor chip 30 is adhered and mounted onto the second solder resist film 32a to direct the connection portions upward. Then, the connection portions of the semiconductor chip 30 and the uppermost Au layer 44y of the upper connection pads C1 (electroplating layer 44) of the third wiring layers 38b are connected electrically mutually via wires 28 by the wire bonding method.

Figure 7G:
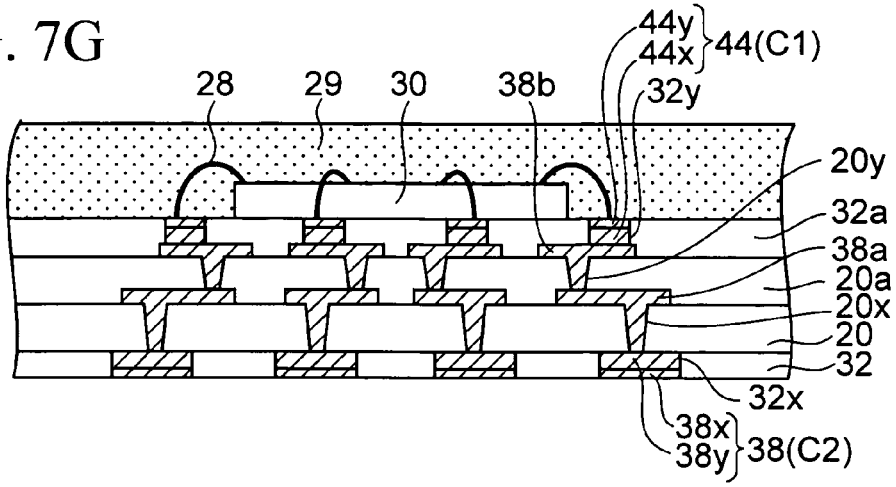

Then, as shown in FIG. 7F, the semiconductor chip 30 is sealed with a mold resin 29. Then, as shown in FIG. 7G, the lowermost Au layers 38x of the first wiring layers 38 are exposed by removed selectively the metal plate 10 from the first solder resist film 32 and the first wiring layers 38 by means of the wet etching similar to the first embodiment. Thus, lower connection pads C2 are obtained.

Figure 7H:
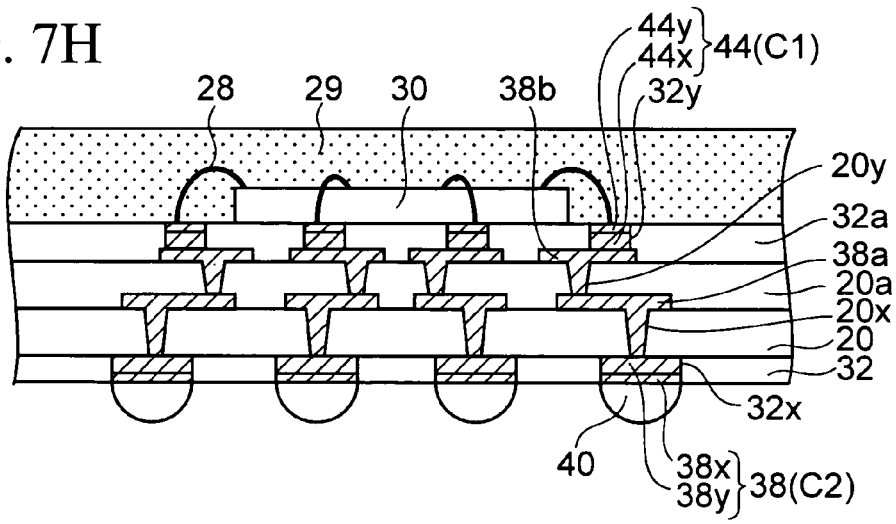

Then, as shown in FIG. 7H, external connection terminals 40 are formed by mounting the solder balls on the lower connection pads C2 (first wiring layers 38), or the like. In the case of the LGA type, the external connection terminals 40 are omitted and the lower connection pads C2 (first wiring layers 38) function as the external connection pads.

Figure 7I:
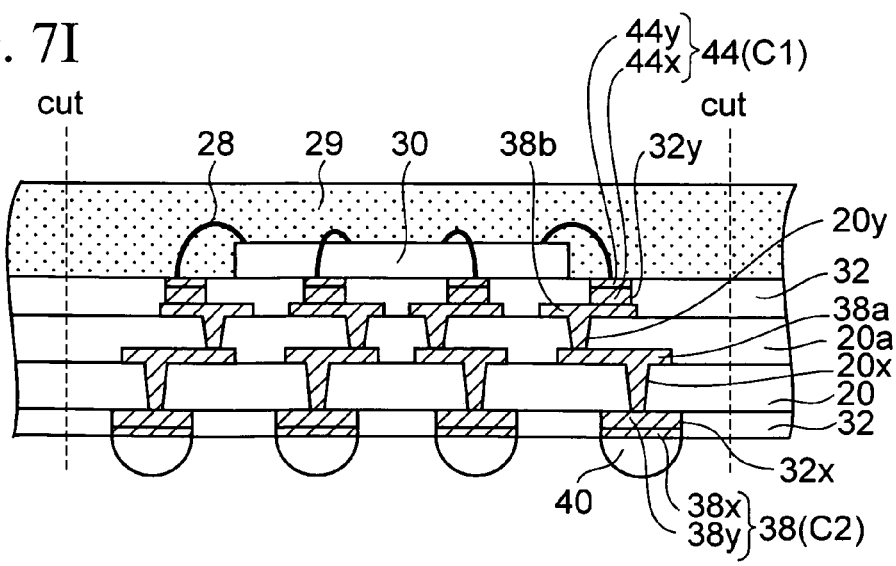

Then, in the present embodiment, because a plurality of semiconductor chip mounting areas are provided on the metal plate 10, the mold resin 29 and the underlying circuit substrate are cut to get individually the mounting area of each semiconductor chip 30, as shown in FIG. 7I.

Figure 7J:
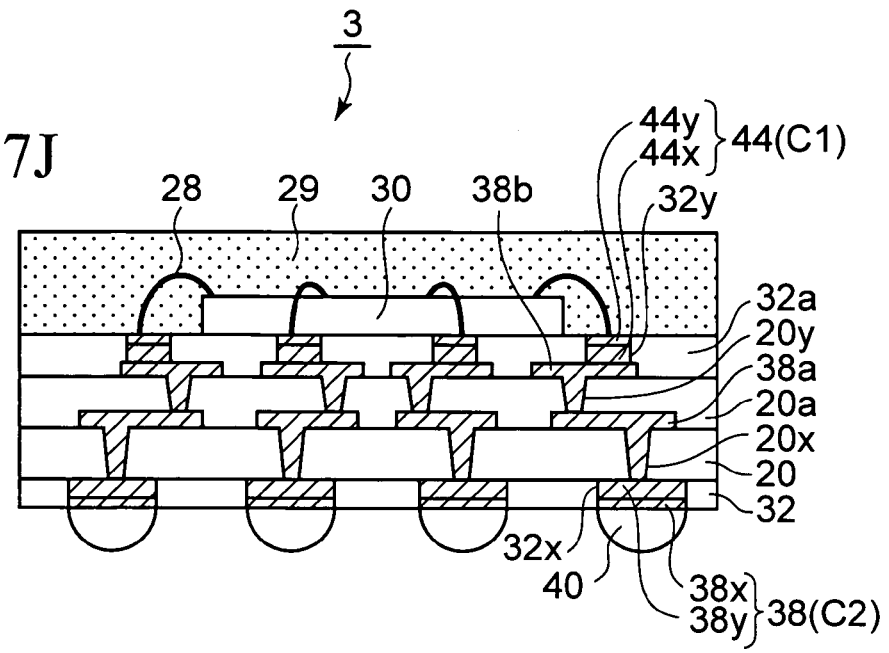

With the above, as shown in FIG. 7J, an electronic parts packaging structure (semiconductor device) 3 constructed by mounting the semiconductor chip on the circuit substrate according to the third embodiment is obtained.

Figure 8:
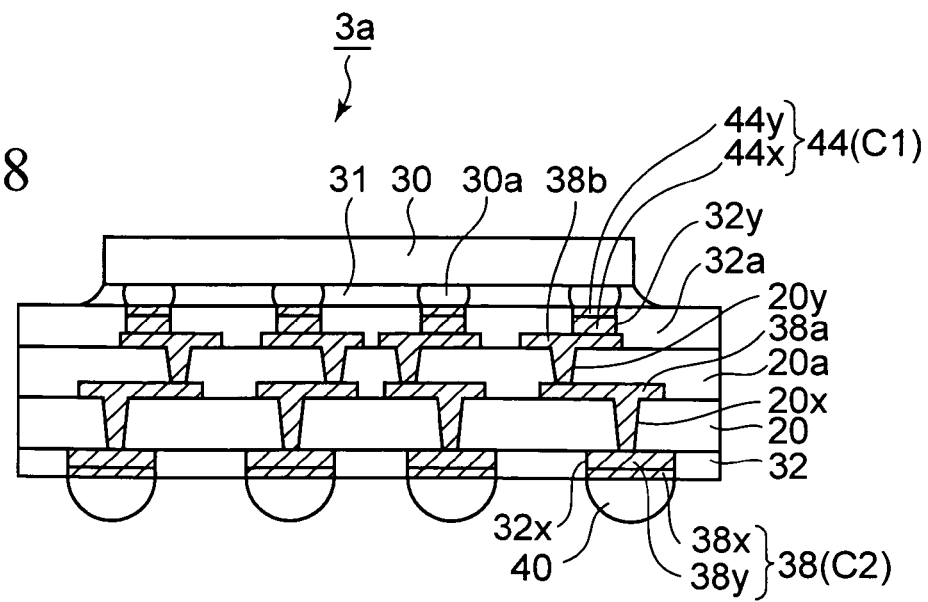
FIG. 8 is a sectional view showing an electronic parts packaging structure according to a variation of the third embodiment of the present invention.

An electronic parts packaging structure 3a according to a variation of the third embodiment is shown in FIG. 8. As shown in FIG. 8, the semiconductor chip 30 to which the bumps 30a are provided may be prepared as the electronic parts in the step in FIG. 7E and then the bumps 30a of the semiconductor chip 30 may be flip-chip bonded to the upper connection pads C1 (electroplating layer 44) on the third wiring layers 38b. In the case of this variation, an underfill resin 31 is filled in a clearance between the semiconductor chip 30 and the underlying circuit substrate. In a mode in which the semiconductor chip 30 is flip-chip mounted, the sealing resin for covering the semiconductor chip 30 is not always formed. In FIG. 8, an example in which the sealing resin is omitted is shown.

In the present embodiment, the method of mounting the electronic parts by the wire bonding method or the flip-chip mounting is exemplified, but the electronic parts may be mounted by various mounting methods. Also, the semiconductor chip is exemplified as the electronic parts, but various electronic parts such as the capacitor parts, or the like may be employed.

As described above, in the method of manufacturing the electronic parts packaging structure according to the third embodiment, first, the first wiring layers 38 each having the Au layer 38x on the lowermost side are formed on the portions, on which the external connection pads are positioned, of the metal$_{13}$ plate 10. Then, the required built-up wiring layer connected to the first wiring layers 38 is formed. Then, the electroplating layers 44, each having the Au layer 44y on the uppermost side, are formed on the connection pad portions of the uppermost wiring layers (third wiring layers 38b) by the electroplating utilizing the metal plate 10 and the built-up wiring layer (first to third wiring layers 38 to 38b) as the plating power-supply path. Then, the electroplating layers 44 act as the upper connection pads C1.

Then, the electronic parts (semiconductor chip, or the like) connected electrically to the upper connection pads C1 is mounted and then the metal plate 10 is removed. Accordingly, the lower surfaces of the first wiring layers 38 are exposed, and the first wiring layers 38 act as the lower connection pads C2 that serve as the external connection pads. Then, the external connection terminals 40 are provided to the lower connection pads C2, in case of necessity.

In the third embodiment, like the first embodiment, the upper connection pads C1 are obtained by forming the electroplating layers 44 on the uppermost wiring layer while utilizing the metal plate and the built-up wiring layer as the plating power-supply path of the electroplating. For this reason, even when the number of the upper connection pads C1 is increased and a pitch between them becomes narrower, such a disadvantage can be eliminated that the connection pads to which the electroplating cannot be applied are produced, and thus the electroplating layer can be formed easily on all connection pads.

Thus, an employment of such manufacturing method makes it easy to manufacture the circuit substrate having the high-density connection pads that correspond to the fine-pitch terminals of the high-performance electronic parts. As a result, the electronic parts packaging structure in which the high-performance semiconductor chip, or the like is mounted can be manufactured easily.

What is claimed is:

1. A method of manufacturing a circuit substrate, comprising the steps of:
    forming, on a metal plate made of copper, a first wiring layer being a land having a multi-layer structure, a bottom side of said multi-layer structure being made of a metal layer having resistance to an etching liquid of the metal plate made of copper, an upper side of said multi-layer structure being made of a copper layer, the first wiring layer being electrically connected to the metal plate;
    forming, on the metal plate, an n-layered (n is an integer of 1 or more) wiring layer electrically connected to the first wiring layer through a via, the copper layer of the first wiring layer connected to the via, an uppermost wiring layer of the n-layered wiring layer having a connection pad area which is electrically connected to a semiconductor chip;
    forming a resin layer in which an opening portion is provided on the connection pad area of the uppermost wiring layer;
    forming an electroplating layer on the connection pad area of the uppermost wiring layer by an electroplating utilizing the metal plate and the wiring layer as a plating power-supply path; and
    removing the metal plate made of the copper selectively to the metal layer having resistance to the etching liquid of the metal plate, thereby exposing the metal layer,
    wherein the resin layer is left on the uppermost wiring layer.

2. A method of manufacturing a circuit substrate, according to claim 1, wherein a semiconductor chip is mounted over the n-layered wiring layer, and the semiconductor chip and the electroplating layer of the connection pad portion are connected via a wire provided by a wire bonding method.

3. A method of manufacturing a circuit substrate, according to claim 1, wherein, in the step of removing the metal plate, a bottom side of the land of the first wiring layer is exposed, and
    the semiconductor chip is flip-chip connected to the land via a bump.

4. A method of manufacturing a circuit substrate, according to claim 1, wherein the multi-layer structure of the land includes a gold layer on a bottom side.

5. A method of manufacturing a circuit substrate, according to claim 1, wherein the multi-layer structure of the land includes a tin layer on a bottom side.

6. A method of manufacturing a circuit substrate, according to claim 1, wherein the electroplating layer includes a gold layer on an uppermost side.

7. A method of manufacturing a circuit substrate, according to claim 1, wherein the metal plate is removed by a wet etching.

8. A method of manufacturing an electronic parts packaging structure, comprising the steps of:

forming, on a metal plate made of copper, a first wiring layer being a land having a multi-layer structure, a bottom side of the multi-layer structure being made of a metal layer having resistance to an etching liquid of the metal plate made of copper, an upper side of the multi-layer structure being made of a copper layer, the first wiring layer being electrically connected to the metal plate;

forming, on the metal plate, an n-layered (n is an integer of 1 or more) wiring layer electrically connected to the first wiring layer through a via, the copper layer of the first wiring layer connected to the via, an uppermost wiring layer of the n-layered wiring layer having a connection pad area;

forming a resin layer in which an opening portion is provided on the connection pad area of the uppermost wiring layer;

forming an electroplating layer on the connection pad area of the uppermost wiring layer by an electroplating utilizing the metal plate and the wiring layer as a plating power-supply path;

mounting an electronic parts connected electrically to the electroplating layer provided onto the connection pad area of the uppermost wiring layer; and removing the metal plate made of the copper selectively to the metal layer having resistance to the etching liquid of the metal plate, thereby exposing the metal layer, wherein the resin layer is left on the uppermost wiring layer.

9. A method of manufacturing an electronic parts packaging structure, according to claim 8, wherein the multi-layer structure of the land includes a gold layer on a bottom side.

10. A method of manufacturing an electronic parts packaging structure, according to claim 8, wherein the electroplating layer includes a gold layer on an uppermost side.

11. A method of manufacturing an electronic parts packaging structure, according to claim 8, further comprising the step of:

providing an external connection terminal on a bottom surface of the land, after the step of removing the metal plate.

12. A method of manufacturing an electronic parts packaging structure, according to claim 8, wherein the electronic parts is a semiconductor chip.

* * * * *